(12) United States Patent
Xie et al.

(10) Patent No.: US 10,319,731 B2
(45) Date of Patent: Jun. 11, 2019

(54) INTEGRATED CIRCUIT STRUCTURE HAVING VFET AND EMBEDDED MEMORY STRUCTURE AND METHOD OF FORMING SAME

(71) Applicant: GLOBALFOUNDRIES INC., Grand Cayman (KY)

(72) Inventors: Ruilong Xie, Schenectady, NY (US); Chun-Chen Yeh, Danbury, CT (US); Tenko Yamashita, Schenectady, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/673,548

(22) Filed: Aug. 10, 2017

(65) Prior Publication Data
US 2019/0051659 A1    Feb. 14, 2019

(51) Int. Cl.
*H01L 27/11556* (2017.01)
*H01L 27/11526* (2017.01)
(Continued)

(52) U.S. Cl.
CPC ........... *H01L 27/11556* (2013.01); *H01L 21/823431* (2013.01); *H01L 21/823487* (2013.01); *H01L 27/0886* (2013.01); *H01L 27/11526* (2013.01); *H01L 29/41741* (2013.01); *H01L 29/41791* (2013.01); *H01L 29/42324* (2013.01); *H01L 29/66666* (2013.01); *H01L 29/66795* (2013.01); *H01L 29/66825* (2013.01); *H01L 29/7827* (2013.01); *H01L 29/7855* (2013.01); *H01L 29/7889* (2013.01)

(58) Field of Classification Search
CPC ..... H01L 21/823431; H01L 21/823487; H01L 21/823821; H01L 21/823885; H01L 27/0886; H01L 27/0924; H01L 29/41741; H01L 29/41791; H01L 21/42324; H01L 29/66666; H01L 29/66795; H01L 29/66825; H01L 29/7827; H01L 29/785; H01L 29/7851; H01L 29/7855; H01L 29/788; H01L 29/7889
See application file for complete search history.

(56) References Cited

U.S. PATENT DOCUMENTS 6,657,250 B1    12/2003    Rudeck
7,960,242 B2    6/2011    Or-Bach et al.
(Continued)

*Primary Examiner* — Stephen W Smoot
(74) *Attorney, Agent, or Firm* — Anthony Canale; Hoffman Warnick LLC

(57) ABSTRACT

The disclosure is directed to an integrated circuit structure and method of forming the same. The integrated circuit structure may include: a first device region including: a floating gate structure substantially surrounding a first fin that is over a substrate; a first bottom source/drain within the substrate, and beneath the first fin and the floating gate structure; a first top source/drain over the first fin and the floating gate structure; a first spacer substantially surrounding the first top source/drain and disposed over the floating gate structure; and a gate structure substantially surrounding and insulated from the floating gate structure, the gate structure being disposed over the substrate and having a height greater than a height of the floating gate.

9 Claims, 19 Drawing Sheets

(51) Int. Cl.
  *H01L 29/417* (2006.01)
  *H01L 29/66* (2006.01)
  *H01L 29/78* (2006.01)
  *H01L 21/8234* (2006.01)
  *H01L 29/423* (2006.01)
  *H01L 27/088* (2006.01)
  *H01L 29/788* (2006.01)

(56) References Cited

U.S. PATENT DOCUMENTS

| | | |
|---|---|---|
| 8,058,137 B1 | 11/2011 | Or-Bach et al. |
| 8,787,082 B2 | 7/2014 | Son et al. |
| 9,306,063 B2 | 4/2016 | Doyle et al. |
| 9,425,326 B2 | 8/2016 | Kar et al. |
| 9,780,100 B1 * | 10/2017 | Balakrishnan .... H01L 29/66545 |
| 2007/0004570 A1 | 1/2007 | Afanasenko et al. |
| 2015/0091058 A1 | 4/2015 | Doyle et al. |
| 2016/0126249 A1 | 5/2016 | Divakaruni et al. |
| 2016/0190282 A1 | 6/2016 | Doyle et al. |
| 2016/0365456 A1 * | 12/2016 | Liu ................... H01L 29/7883 |

* cited by examiner

INTEGRATED CIRCUIT STRUCTURE HAVING VFET AND EMBEDDED MEMORY STRUCTURE AND METHOD OF FORMING SAME

BACKGROUND

Technical Field

The present disclosure relates to integrated circuit structures, and more particularly to an integrated circuit structure having a vertical field-effect transistor (VFET) and an embedded memory structure.

Related Art

Flash memory is commonly used in mobile devices, personal computers, servers, digital audio players, digital cameras, synthesizers and video games. Scaling of currently available flash memory devices is limited due to the inability to scale the amount of electrical charge stored in a floating gate. In addition, conventional planar field effect transistors (FETs) are replaced with fin FETs and vertical FETs in advanced logic circuitry. To date, a silicon based floating gate embedded memory cell that is compatible with advanced vertical FET technologies has not been accomplished because it would require a complicated fabrication scheme.

SUMMARY

A first aspect of the disclosure is directed to an integrated circuit structure. The integrated circuit structure may include: a first device region including: a floating gate structure substantially surrounding a first fin that is over a substrate; a first bottom source/drain within the substrate, and beneath the first fin and the floating gate structure; a first top source/drain over the first fin and the floating gate structure; a first spacer substantially surrounding the first top source/drain and disposed over the floating gate structure; and a gate structure substantially surrounding and insulated from the floating gate structure, the gate structure being disposed over the substrate and having a height greater than a height of the floating gate.

A second aspect of the disclosure is directed to a method of forming an integrated circuit structure. The method may include: providing a precursor structure including a first device region having a first fin over a first bottom source/drain within a substrate, and a second device region having a second fin over a second bottom source/drain within the substrate; forming a floating gate material over the substrate and laterally adjacent to the first fin in the first device region and laterally adjacent to the second fin in the second device region; forming a first spacer over a first portion of the floating gate material in each of the first and second device regions such that a second portion of the floating gate material in each of the first and second device regions is exposed; forming a first top source/drain in the first device region over the first fin and a second top source/drain over the second fin in the second device region; removing the second portion of the floating gate material in each of the first and second device regions such that the first portion of the floating gate material remains beneath the first spacer in each of the first and second device regions; depositing a dielectric within each of the first and second device regions such that the dielectric is partially disposed laterally adjacent to the first portion of the floating gate material that remains beneath the first spacer in each of the first and second device regions; removing the first portion of the floating gate material and the dielectric from the first device region such that a portion of the first fin in the first device region is exposed, and such that the first portion of the floating gate material remains beneath the first spacer in the second device region and defines a floating gate structure; and forming a gate structure in each of the first device region and the second device region, the gate structure in the first device region being laterally adjacent to the exposed portion of the first fin, and the gate structure in the second device region being laterally adjacent to the floating gate structure that is disposed beneath the first spacer in the second device region, wherein the gate structure in the second device region includes a height that is greater than a height of the gate structure in the first device region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 1-16 show a cross-sectional view of an integrated circuit structure undergoing aspects of a method according to embodiments of the disclosure, wherein FIG. 16 shows a resulting integrated circuit structure according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, and more particularly to an integrated circuit structure having a vertical field-effect transistor (VFET) and an embedded memory structure. Embodiments of the disclosure provide for methods and structure for an improved vertical memory device adjacent to logic transistors that can be integrated with vertical field effect transistors (VFETs) at 5 nanometer technology nodes and beyond.

It will also be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Spatially relative terms, such as "inner," "outer," "beneath", "below", "lower," "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Figure 1:
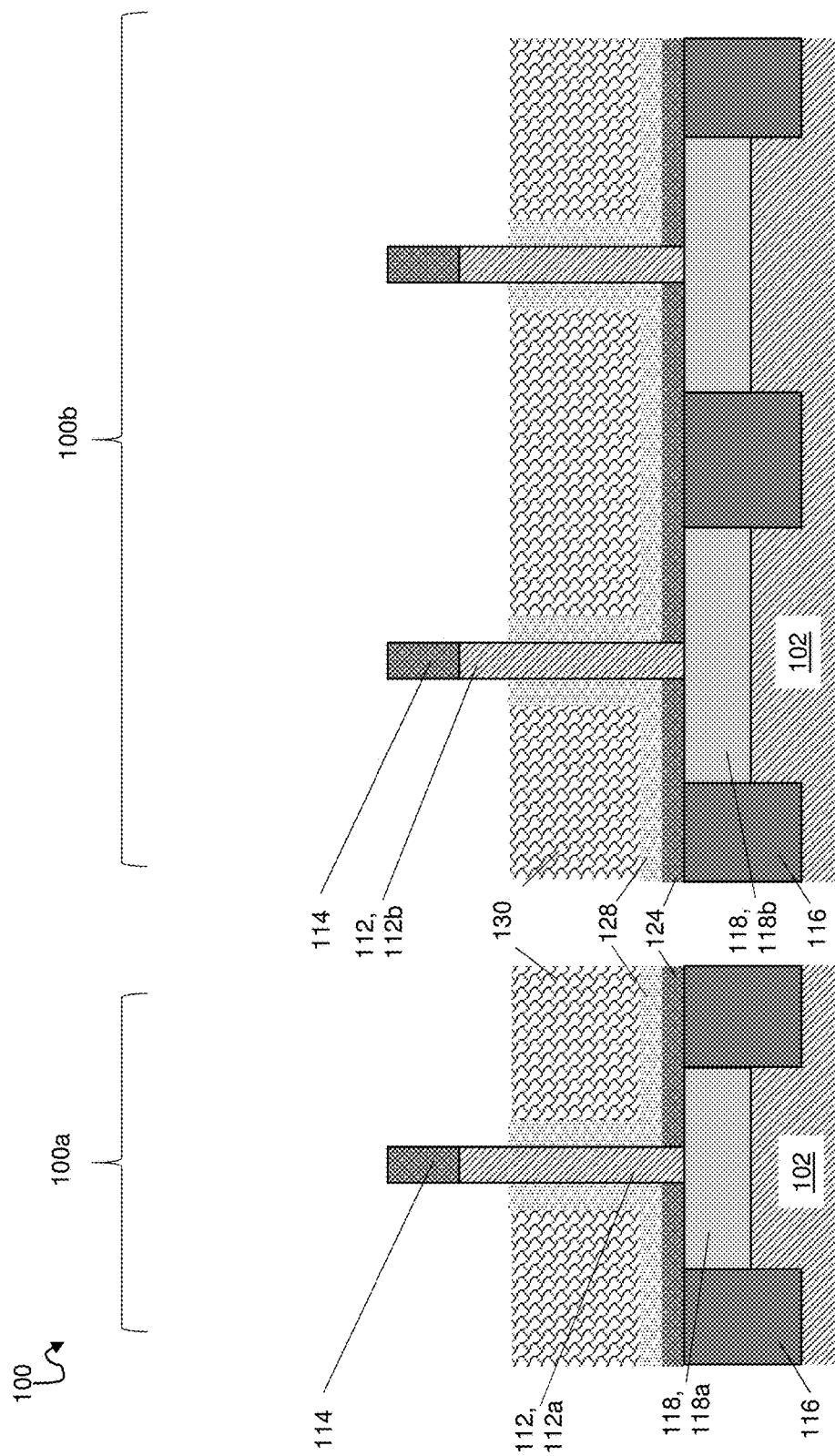

Referring to FIG. 1, a cross-sectional view of a precursor structure 100 to be processed according to embodiments of the disclosure is shown. Precursor structure 100 may represent a portion of a larger IC structure which has previously been formed, processed, etc., to include the various initial structures described herein. Precursor structure 100 can be structured to include a first device region 100a and a second device region 100b at respective portions thereof. Device region 100b may be laterally adjacent to, proximal to, or located elsewhere within precursor structure 100 relative to device region 100a.

Precursor structure 100 may include a substrate 102. As shown, substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 of precursor structure 100 may be formed by forming a semiconductor material on an underlying structure (not shown). According to an example, substrate 102 can be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Still referring to FIG. 1, one or more fins 112 may be formed from substrate 102. Each fin 112 may be formed by forming a mask 114 over various portions of a semiconductor layer, and patterning and etching mask 114 such that a portion of mask 114 remains intact where fin(s) 112 are desired. Subsequently, the original semiconductor material may be etched such that the portion of substrate 102 that is covered or protected by mask 114 forms fin 112. Masks appropriate for the formation of fins 112 may include a single layer or combination of layers formed from, e.g., silicon nitride, or any other hard mask material known in the art. While three fins 112 are shown in regions 100a, 100b of precursor structure 100, it is understood that any number of fins 112 (e.g., one fin, five fins, one hundred fins, one thousand or more fins, etc.) may be formed on substrate 102 without departing from aspects of the disclosure. The embodiments described herein are thus operable for processing one fin 112 and/or multiple fins 112. As shown, precursor structure 100 may include a first fin 112a in region 100a and a second fin 112b in region 100b. It is also understood that fins 112 can be formed on substrate 102 by way of other techniques, some of which may include different masks and/or may not include masks. Such methods can include, e.g., patterning a mandrel and thereafter forming fins 112 by epitaxial definition on substrate 102. As shown, a portion of mask 114 may remain over a top surface of fins 112.

Precursor structure 100 may also include an isolation region 116 within substrate 102 to separate device regions, e.g., device regions 100a, 100b, and/or fins 112. For example, isolation region 116 may be disposed on opposing sides of fin 112 with substrate 102 such that isolation region 116 separates adjacent fins 112. Isolation region 116 may include a shallow trench isolation (STI) which may be formed by etching a trench within substrate 102 and filling, e.g., by deposition, the trench with an insulator, e.g., silicon oxide, silicon nitride, or silicon oxynitride.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Substrate 102 and/or portions thereof may be p- or n-type doped such that substrate 102 and/or portions thereof may function as a bottom source/drain terminal. For example, a portion of substrate 102 may be doped between and/or beneath adjacent fins 112 to create a first bottom source/drain 118a in device region 100a and a second bottom source/drain 118b in device region 100b. Bottom source/drains 118a, 118b may be formed before or after formation of fins 112.

A bottom spacer 124 may be formed over substrate 102 between adjacent fins 112 in each device region 100a, 100b. Bottom spacer 124 may be formed, e.g., by directional dielectric deposition. Bottom spacer 124 may include, for example, at least one of: silicon nitride (SiN), silicon boron carbonitride (SiBCN), silicon oxycarbonitride (SiOCN), silicon oxycarbide (SiCO), or silicon oxide ($SiO_2$). Further, a dielectric 128 may be formed over bottom spacer 124, and a charge trapping material or a floating gate material (hereinafter "floating gate material") 130 may be formed over dielectric 128 in each device region 100a, 100b. More specifically, dielectric 128 may be conformally deposited over bottom spacer 124 and fins 112 (having mask 114 thereover). Dielectric 128 may include, for example, silicon oxide.

Floating gate material 130 may be formed over substrate 102, and laterally adjacent to fin 112a in device region 100a and laterally adjacent to fin 112b in device region 100b. More specifically, floating gate material 130 may be deposited over dielectric 128 in each device region 100a, 100b. Floating gate material 130 may include, for example, polysilicon. As will be described hereinafter, a portion of floating gate material 130 may remain to function as a part of a floating gate structure in device region 100b in the formation of a vertical flash memory, but the floating gate material 130 in device region 100a may be removed later as a sacrificial layer in the formation of a vertical FET. Floating gate material 130 and dielectric 128 may be recessed to a height that exposes a top or upper portion of fins 112 having mask 114 thereover.

Figure 2:
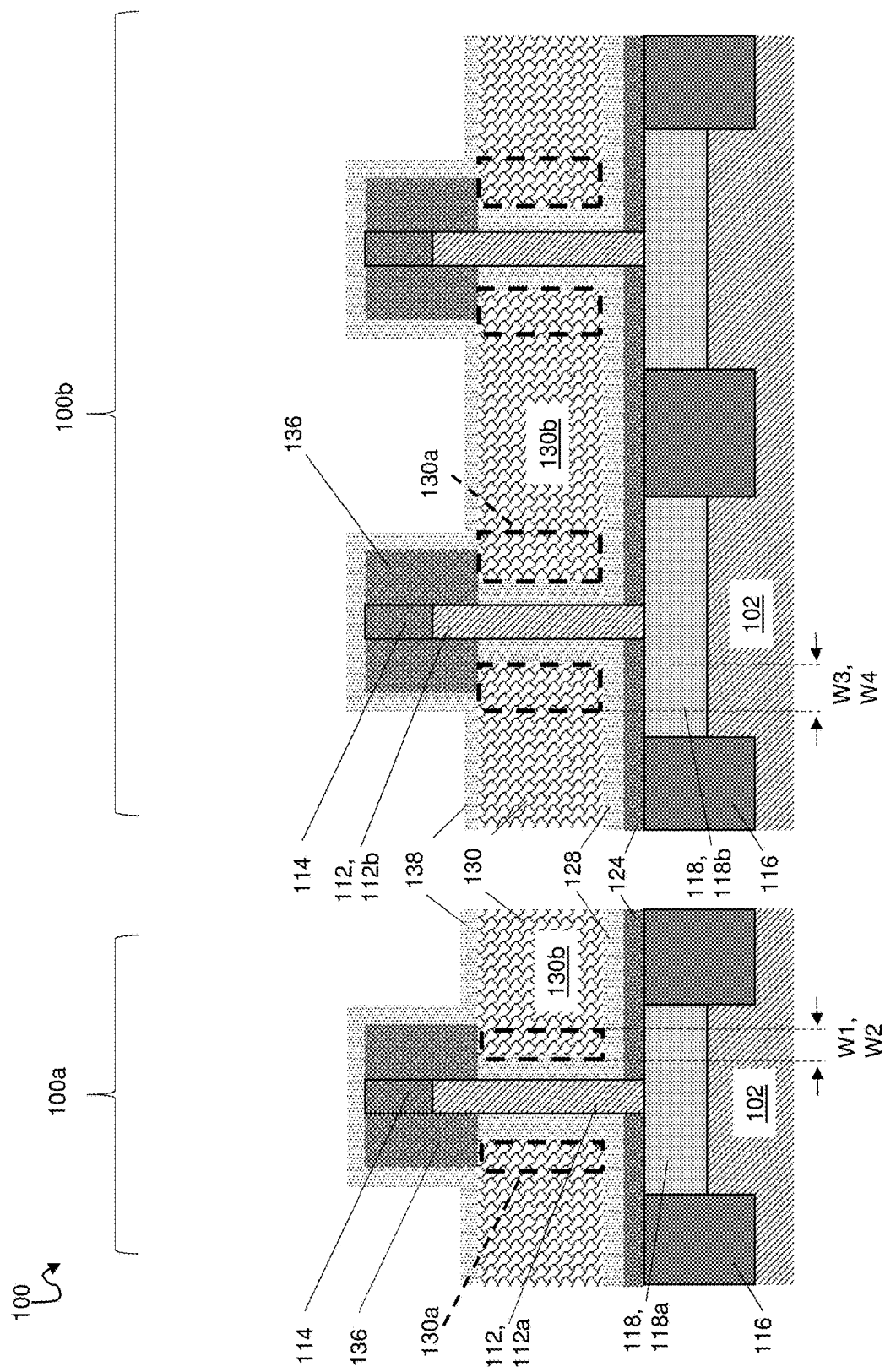

Turning now to FIG. 2, a spacer 136 may be formed over floating gate material 130 within device regions 100a, 100b and laterally adjacent to the exposed top portion of fins 112 in each device region 100a, 100b. Spacer 136 may be formed by depositing any now known or later developed spacer material, e.g., silicon nitride, and etching such that spacer 136 remains over portions of floating gate material 130 immediately laterally adjacent to the top portions of fins 112. Further, another dielectric 138 may be conformally deposited over exposed surfaces in each of first and second device regions 100a, 100b. More specifically, dielectric 138 may be formed over exposed portions of floating gate material 130, spacers 136, and fins 112 having mask 114 thereover.

The differences in size and position in device regions 100a, 100b can cause floating gate material 130 to serve different functions in each region. The formation of spacer 136 and/or dielectric 138 on respective portions of floating gate material 130 define a floating gate structure in device region 100b. By contrast, floating gate material 130 covered by spacer 136 can be used to define an active gate structure in device region 100a.

More specifically, spacer 136 may define a first portion 130a of floating gate material 130 within device region 100a that is to be replaced with an active gate structure. In this way, first portion 130a of floating gate material 130 is a sacrificial material which is to be removed and replaced with the gate structure in device region 100a. Spacer 136 within device region 100a may have a width W1 that is approximately equal to a desired width of the gate structure to be formed therein. In one example, width W1 may be approximately equal to less than 10 nanometers (nm). Since first portion 130a of floating gate material 130 within device region 100a is defined by spacer 136, first portion 130a may have a width W2 approximately equal to width W1 of spacer 136.

Spacer 136 and a vertical portion of dielectric 138 that extends along spacer 136 may together define a first portion 130a of floating gate material 130 within device region 100b that is to define a floating gate structure therein. Spacer 136 and a vertical portion of dielectric 138 that extends along spacer 136 in device region 100b may have a width W3 approximately equal to a desired width of the floating gate structure to be formed therein. In one example, width W3 may be approximately equal to 10 nm or greater. Since first portion 130a of floating gate material 130 in device region 100b is defined by spacer 136 and the vertical portion of dielectric 138, first portion 130a may have a width W4 approximately equal to width W3 of spacer 136 and dielectric 138 together. A second portion 130b of floating gate material 130 may include any remaining portions of floating gate material 130 beyond first portion 130a and which will be removed from both device regions 100a, 100b.

Figure 3:
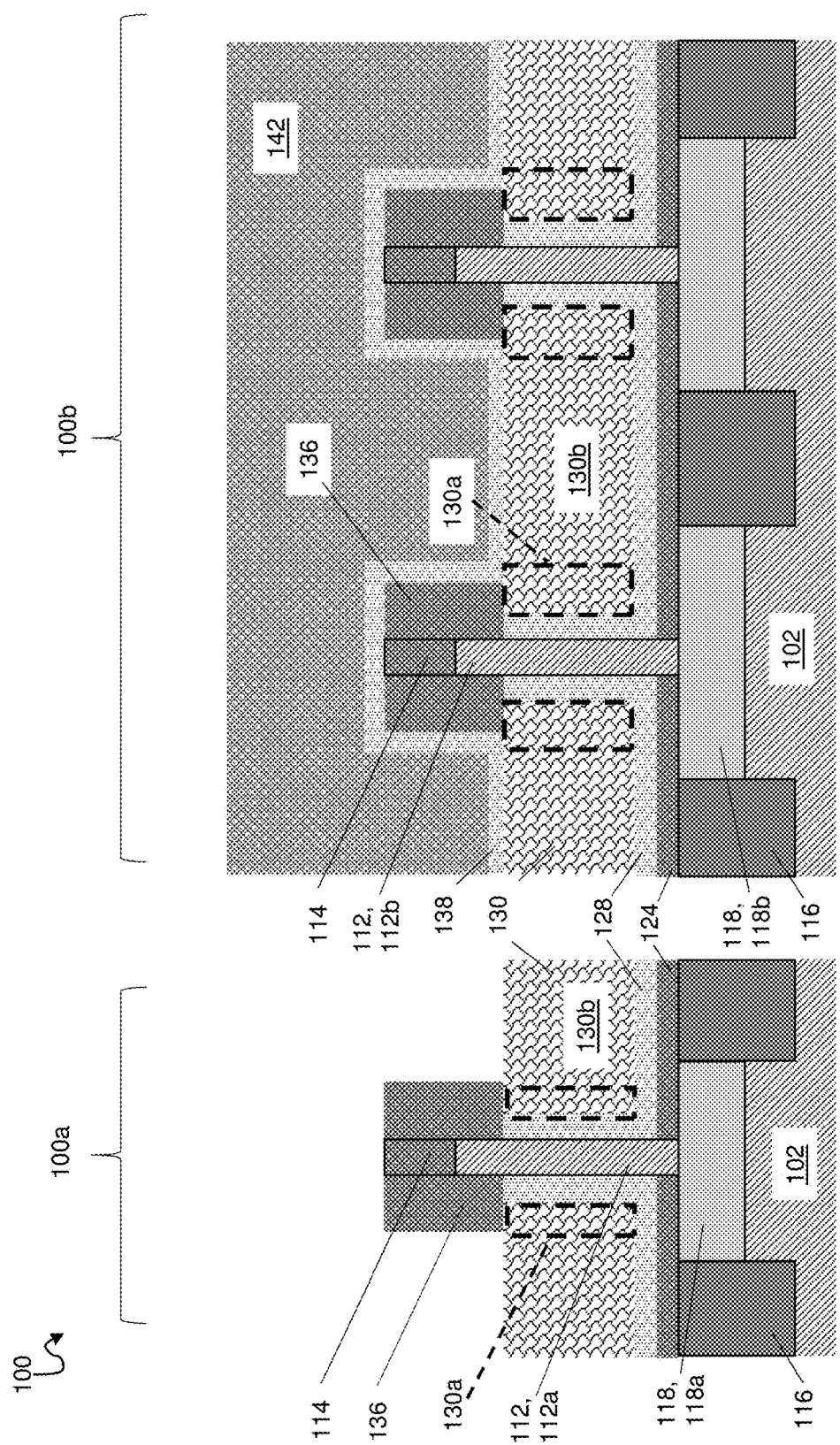

Turning now to FIG. 3, a mask 142 may be formed over structure 100 and patterned and etched such that device region 100a is exposed and device region 100b remains covered by mask 142 in order for device region 100a to undergo desired processing. Mask 142 can include one or more currently known or later developed substances configured to withstand lithographic processing of integrated circuit materials, e.g., an organic planarization layer (OPL), soft masking material, and/or other photoresist materials configured to protect underlying components.

Figure 4:
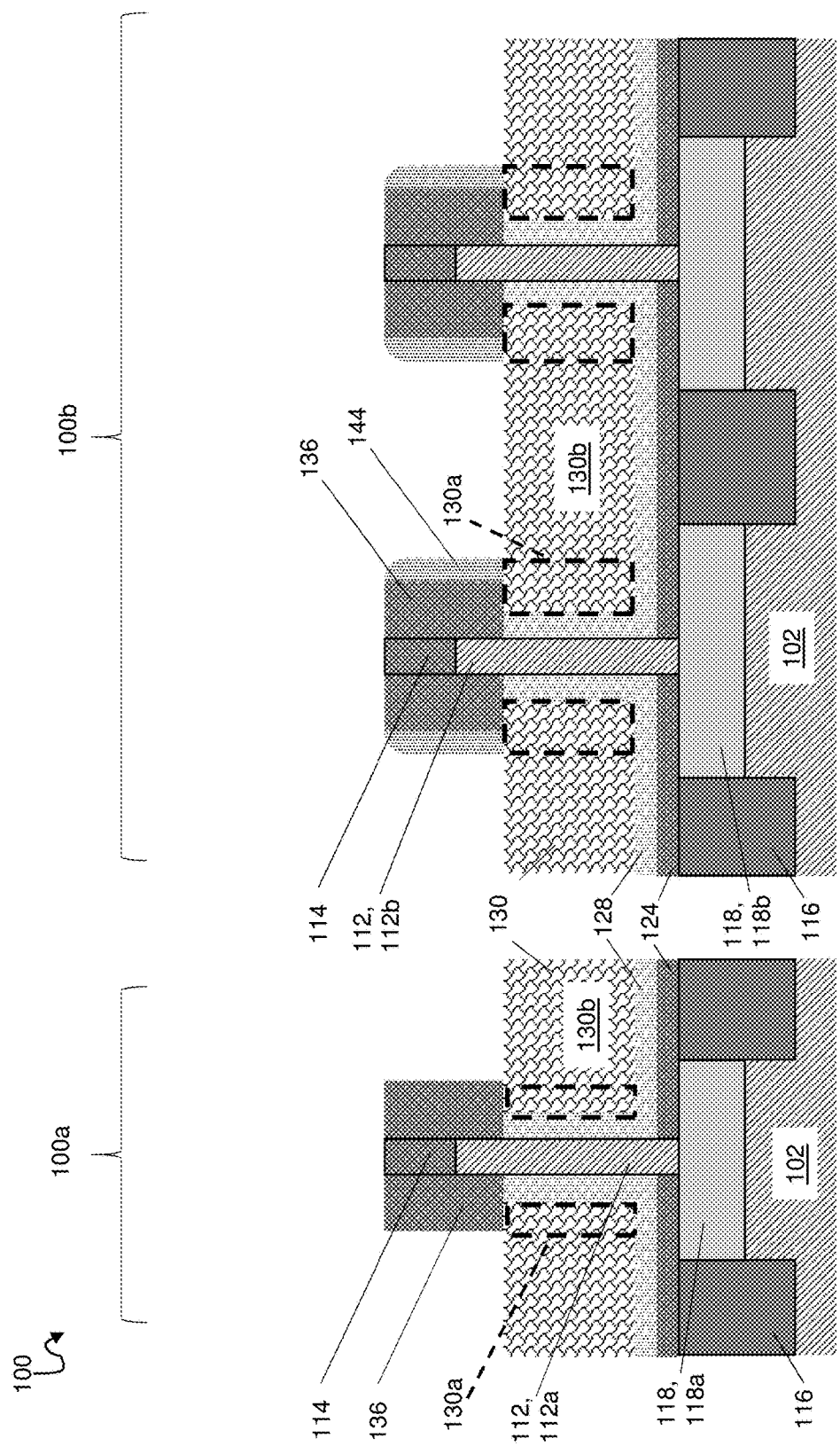

Still referring to FIG. 3, while mask 142 is protecting device region 100b, dielectric 138 may be removed, e.g., by etching, from device region 100a. As a result, spacer 136 and second portion 130b of floating gate material 130 in device region 100a may be exposed. Turning now to FIG. 4, mask 142 (FIG. 3) may be stripped away, e.g., etched or washed, to expose dielectric 138 within device region 100b. Subsequently, an etching, e.g., RIE, may be performed on dielectric 138 such that spacers 144 laterally adjacent to spacers 136 on opposing sides of fins 112 in device region 100b are removed. However, since dielectric 138 was removed from device region 100a, no spacers 144 are formed from dielectric 138 in that region.

Figure 5:
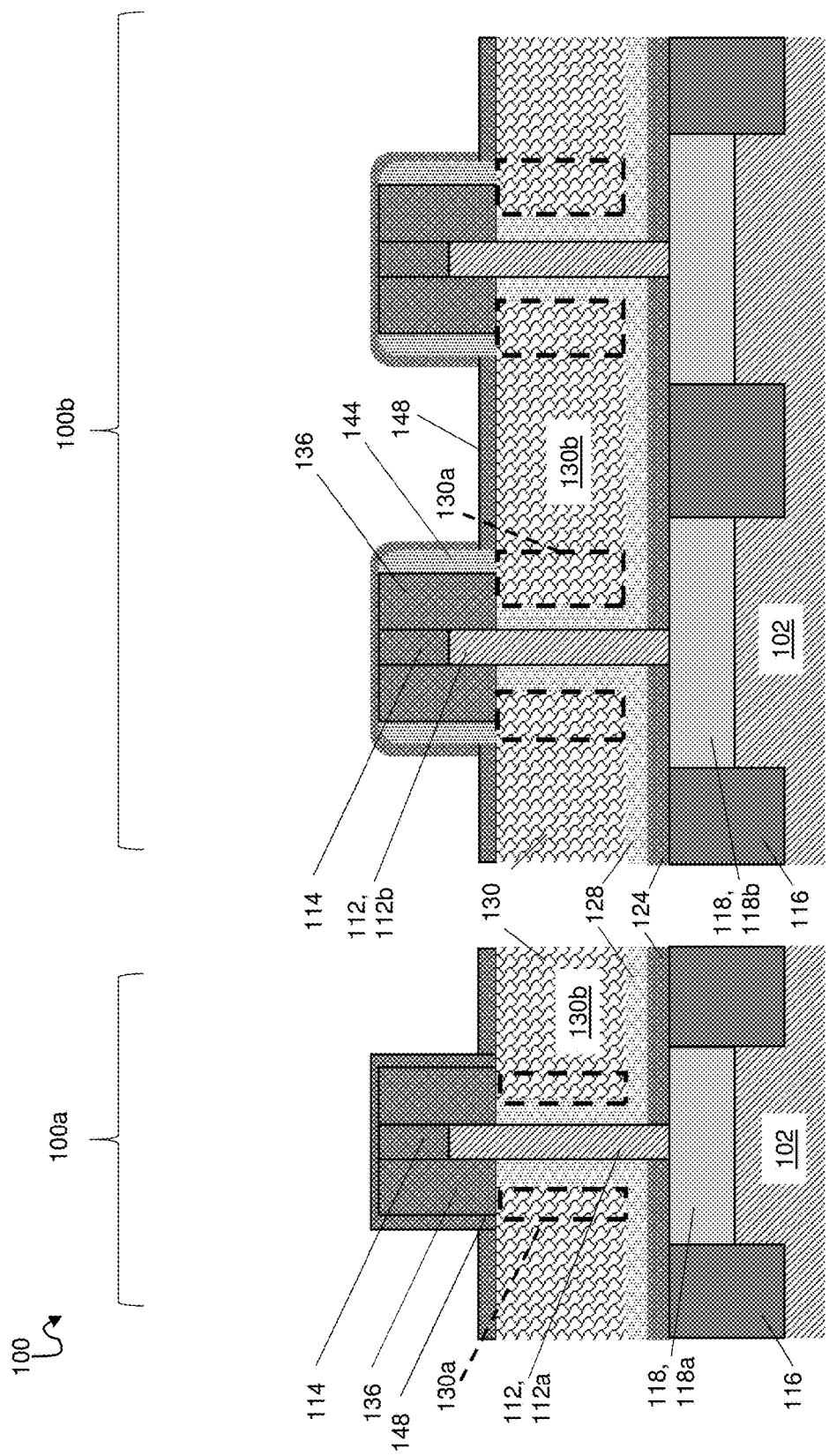

Turning now to FIG. 5, a liner layer 148 may be formed over exposed structures within each of device region 100a, 100b. Liner layer 148 may be formed, e.g., by conformal deposition. More specifically, liner layer 148 may be formed over exposed second portion 130b of floating gate material 130, spacer 136, and fin 112a having mask 114 thereover within device region 100a. Additionally, liner layer 148 may be formed over second portion 130b of floating gate material 130, spacers 136, 144, and fin 112b having mask 114 thereover in device region 100b. Liner layer 148 may include, for example, silicon nitride.

Figure 6:
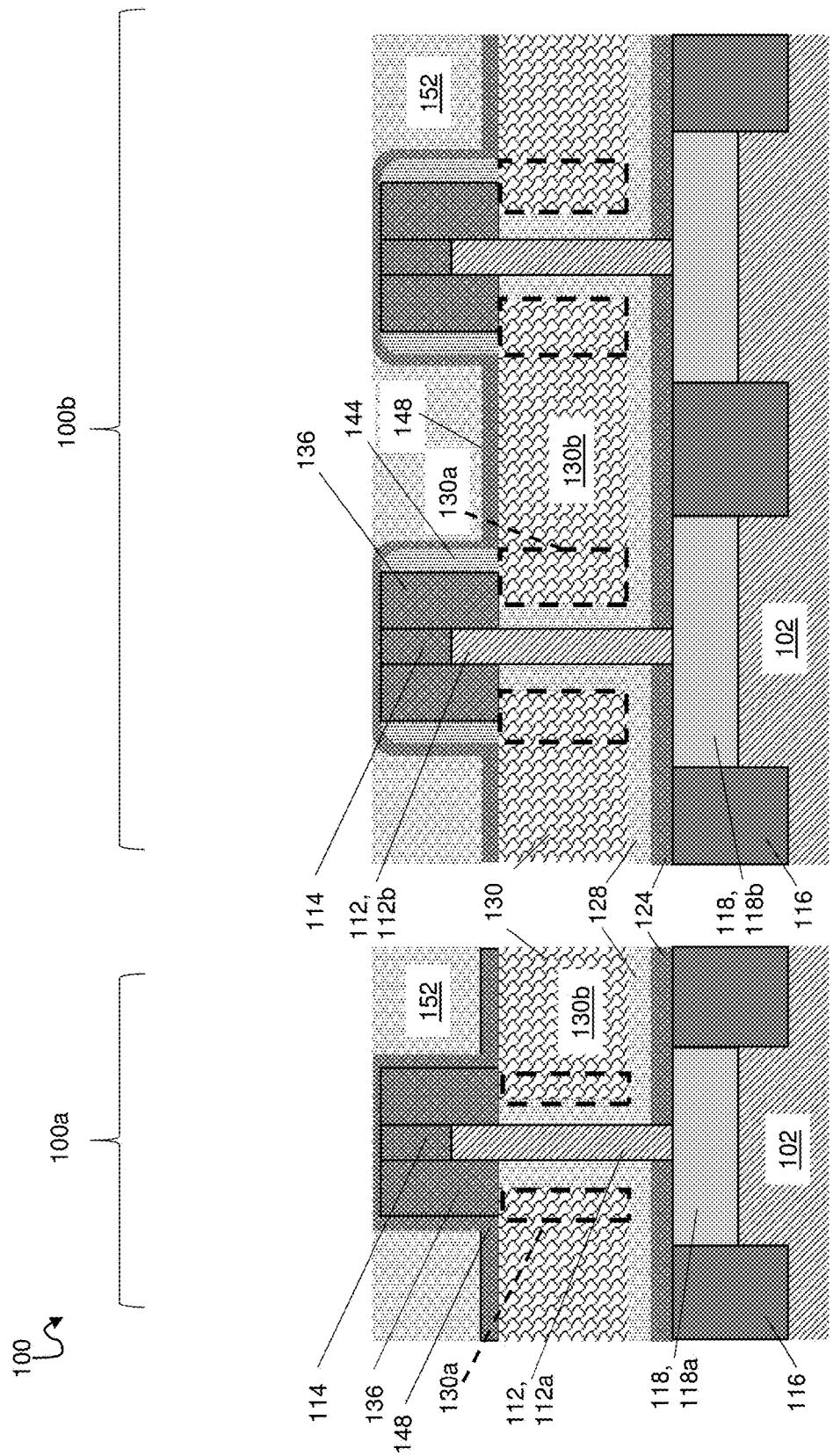
Figure 7:
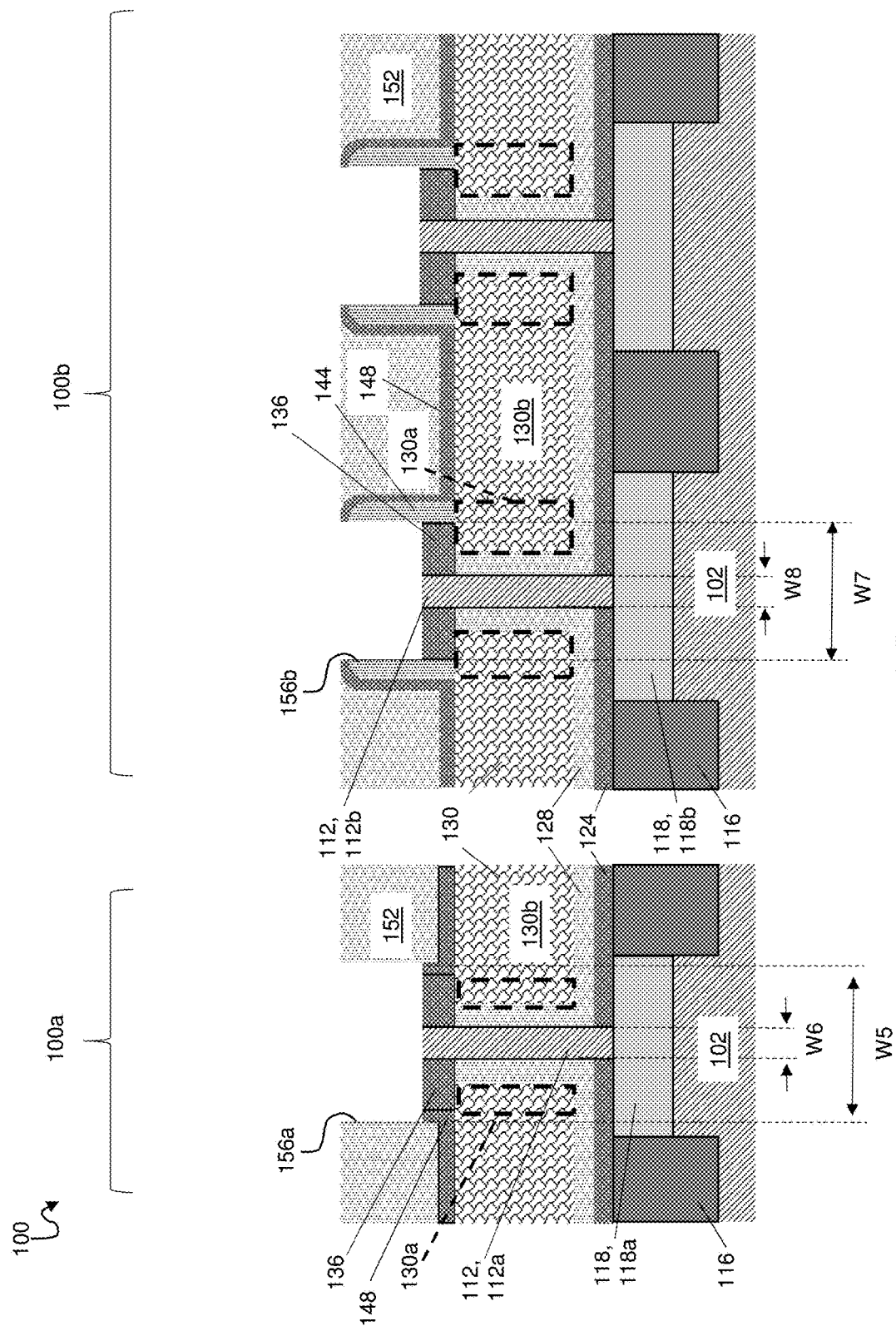

As shown in FIG. 6, another dielectric 152 may be formed over liner layer 148 in each of first and second device regions 100a, 100b. Dielectric 152 may be formed, e.g., by deposition. Dielectric 152 may be planarized to expose a portion of liner layer 148 that is disposed over fins 112 having mask 114 thereover. Dielectric 152 may include, e.g., silicon oxide. As shown in FIG. 7, the exposed portions of liner layer 148 and a portion of spacer 136 thereunder may be removed such that fin 112a is exposed within a first opening 156a within dielectric 152 in first device region 100a. Additionally, mask 114 and portions of fin 112a may also be removed within opening 156a. As a result, fin 112a and remaining portions of spacer 136 may be exposed within opening 156a. Further, portions of liner layer 148 may also be etched along a sidewall of spacer 136 since liner layer 148 may include the same material as spacer 136. In this way, opening 156a may include a lateral width W5 that is greater than a lateral width W6 of first fin 112a. Further, the exposed portions of liner layer 148 and a portion of spacer 136 thereunder may be removed such that fin 112b is exposed within a second opening 156b within dielectric 152 in second device region 100b. Additionally, mask 114 and portions of fin 112b may also be removed within opening 156b. As a result, fin 112b and remaining portions of spacer 136 may be exposed within opening 156b. In this way, opening 156b may include a lateral width W7 that is greater than a lateral width W8 of fin 112b. As will be described herein, top source/drain regions, spacers, and a cap layer may be formed within these openings 156a, 156b. The amounts of the materials removed may be controlled by the etch process and may be selected based on the size of the top source/drain desired.

Figure 8:
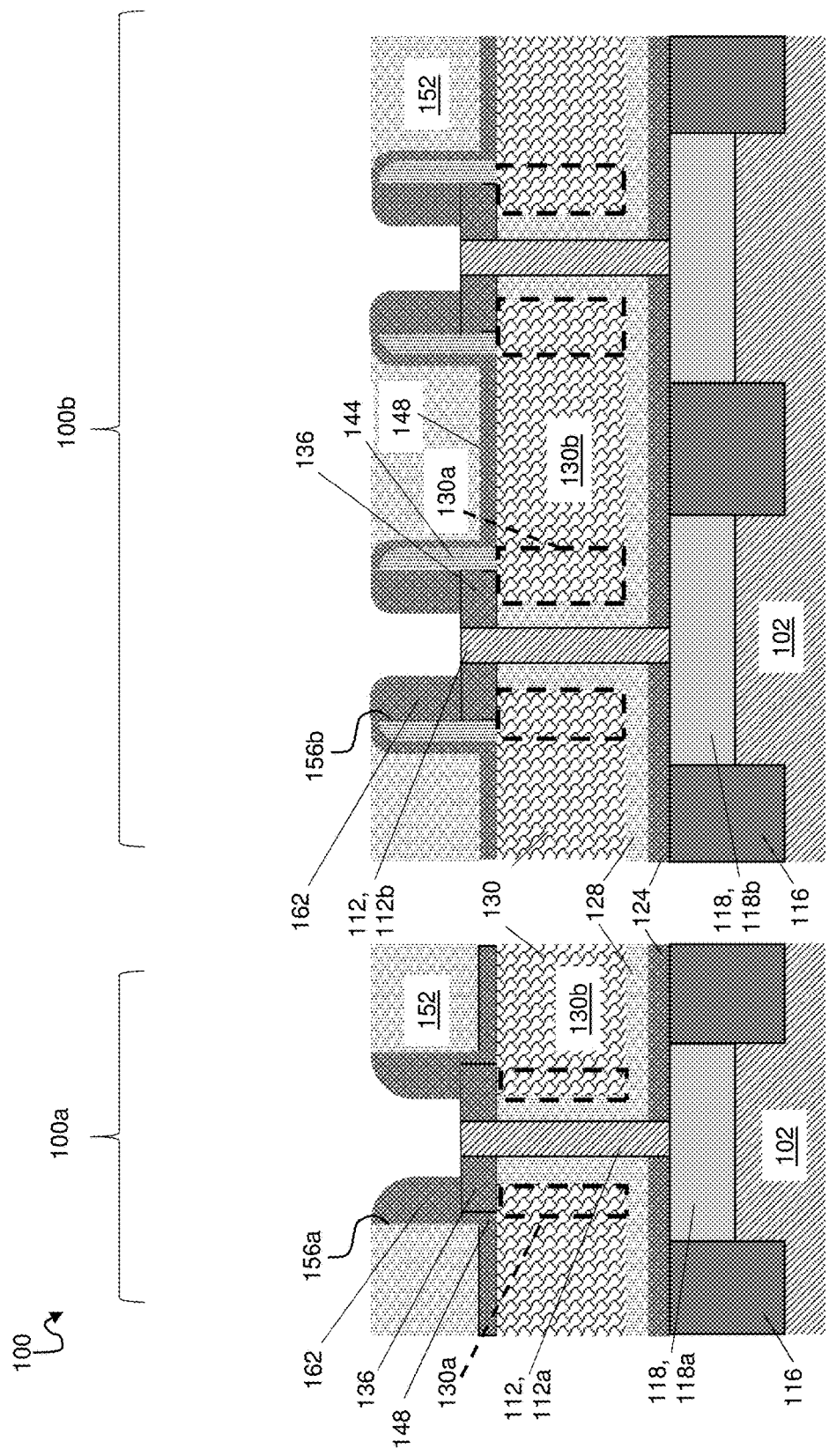
Figure 9:
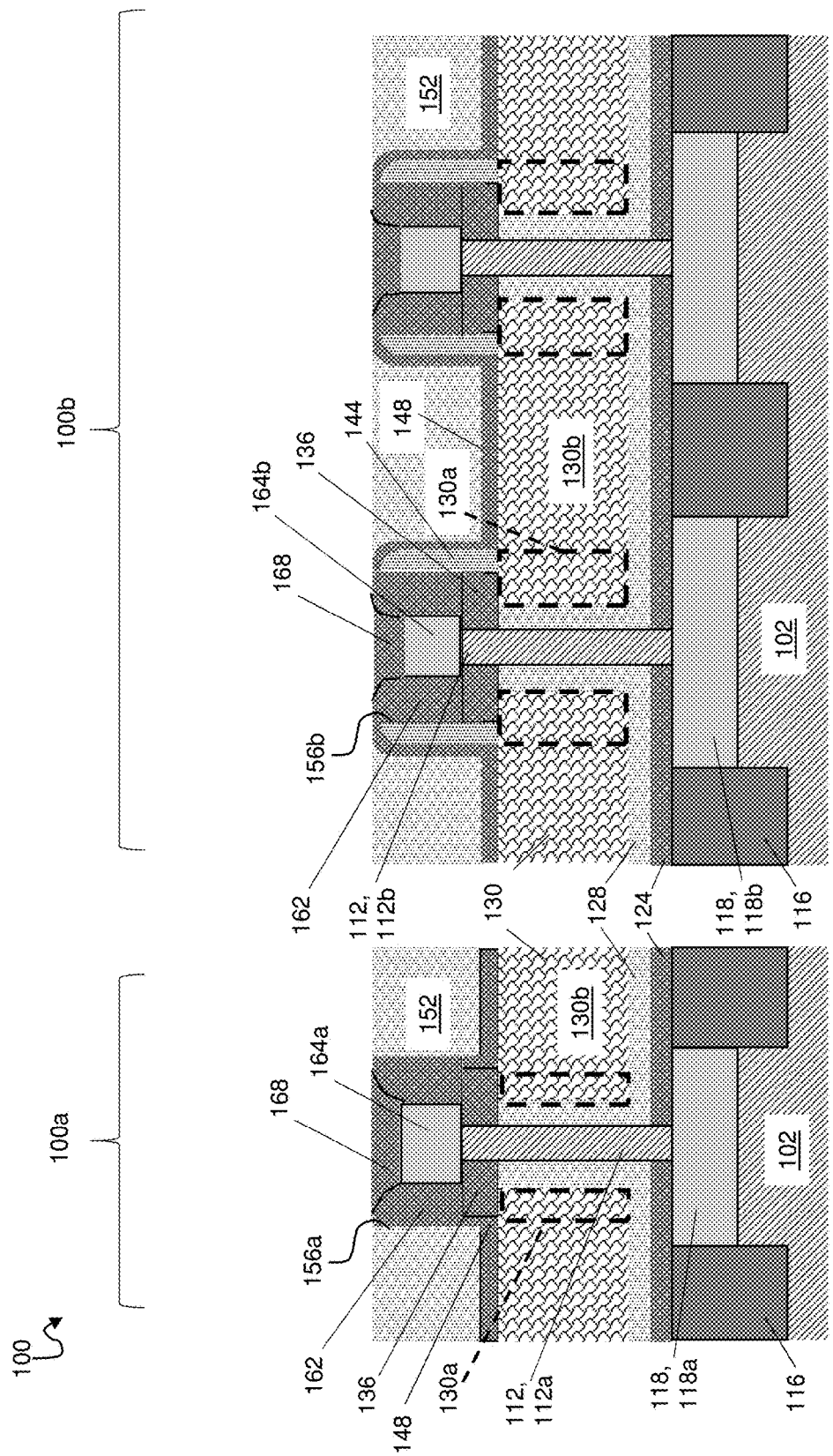

As shown in FIG. 8, spacers 162 may be formed within openings 156a, 156b. Specifically, spacers 162 may be formed along sidewalls of openings 156a, 156b such that fins 112a, 112b remain exposed within openings 156a, 156b. Spacers 162 may be formed, e.g., by deposition and etching. Spacers 162 may include, for example, silicon nitride. Further, as shown in FIG. 9, a first top source/drain 164a may be formed over fin 112a within opening 156a in device region 100a. Further, a second top source/drain 164b may be formed over fin 112b within opening 156b in device region 100b. Top source/drains 164a, 164b can be formed on fin(s) 112, e.g., by deposition, ion implantation, and/or selective epitaxial growth on fins 112. Top source/drain 164a, 164b can include any semiconductor material appropriate for operation as a source/drain material in a transistor. Spacer 162 may substantially surround top source/drains 164a, 164b such that spacers 162 are disposed laterally adjacent to top source/drains 164a, 16b in the cross-sectional view of FIG. 9. In addition, a cap layer 168 may be formed over top source/drains 164a, 164b to fill a remainder of openings 156a, 156b. Together, spacers 160, top source/drains 164a, 164b, and cap layer 168 may substantially fill openings 156a, 156b over fins 112a, 112b. Cap layer 168 may be formed by deposited and planarization.

Figure 10:
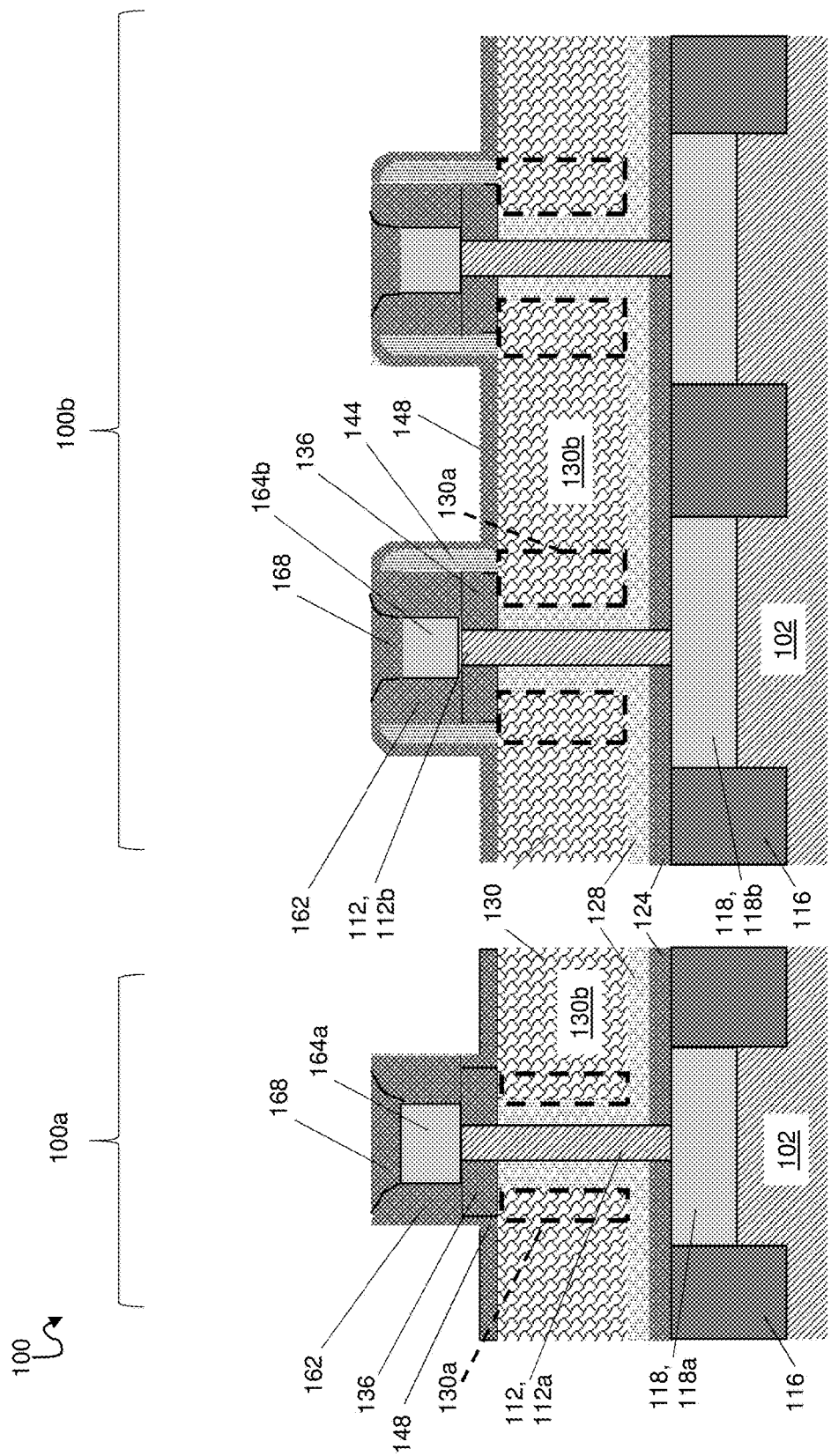
Figure 11:
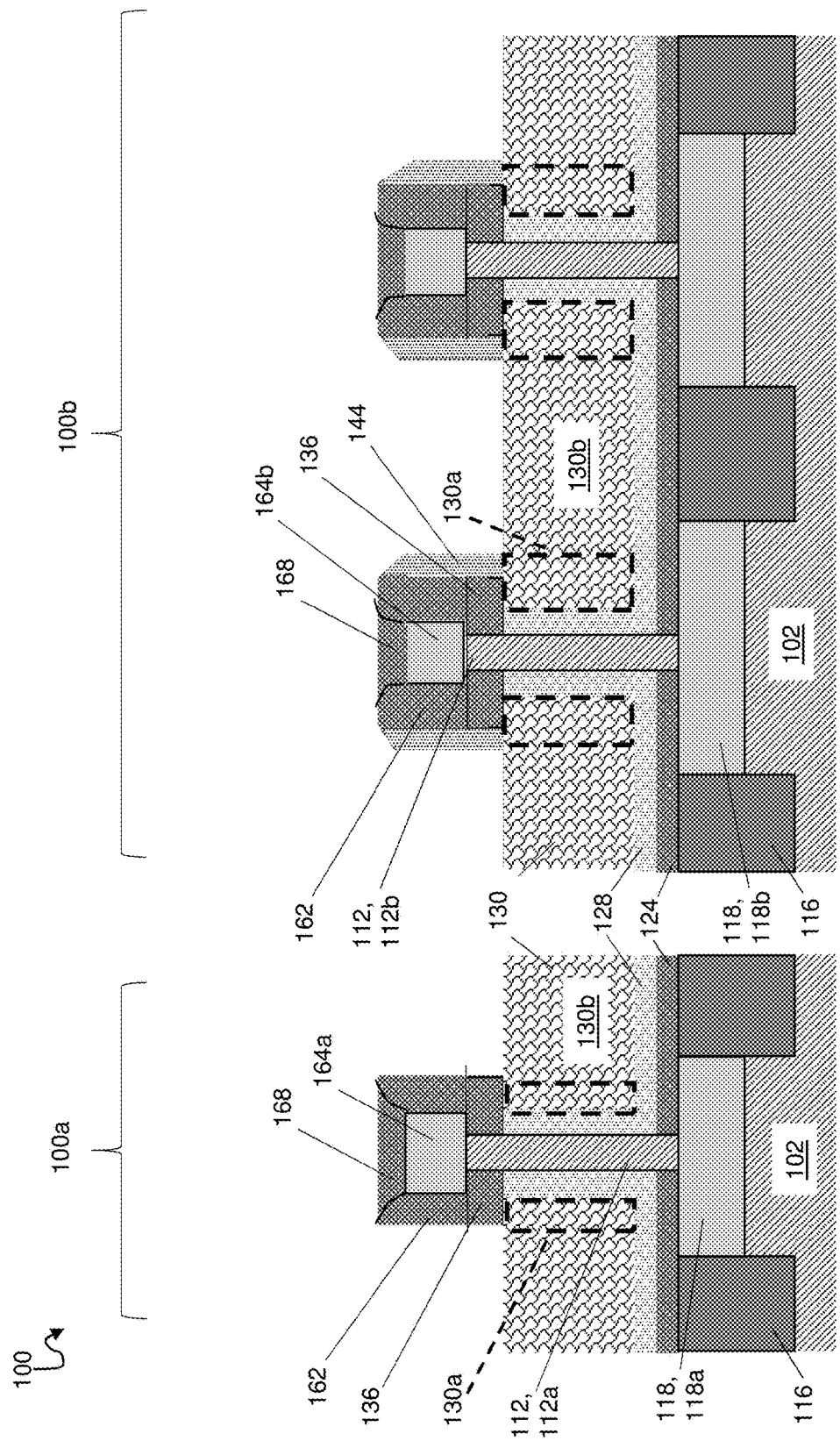

After cap layer 168 is formed, dielectric 152 (FIG. 9) may be removed, e.g., by etching, as shown in FIG. 10. As a result, liner layer 148 thereunder may be exposed. As shown in FIG. 11, liner layer 148 may be removed, e.g., by etching. As a result, spacers 136, 162 and second portion 130b of floating gate material 130 may be exposed in device region 100a. In addition, spacers 136, 144, 162 and second portion 130b of floating gate material 130 that is not covered by spacers 136, 144, 162 may be exposed in device region 100b.

Figure 12:
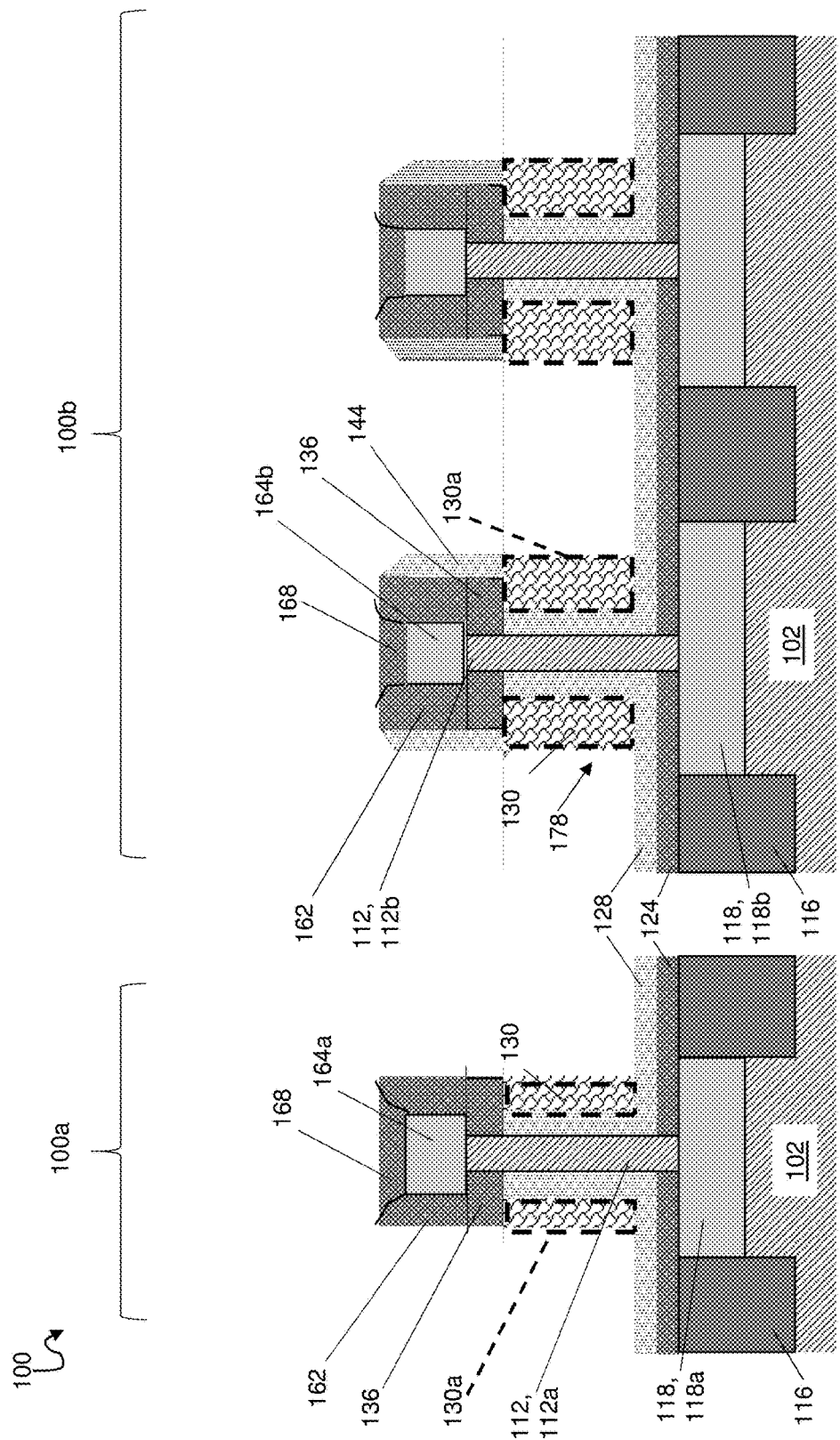

As shown in FIG. 12, an etching may be performed to remove exposed portions of floating gate material 130, e.g., second portion 130b, from device regions 100a, 100b. That is, a portion of floating gate material 130 that is not covered by a spacer, e.g., spacers 136, 162, or some other material may be removed. First portion 130a of floating gate material 130 may remain within device regions 100a, 100b since it is protected by spacers, e.g., spacers 136, 162 in device region 100a and spacers 136, 162 in device region 100b. As will be described herein, first portion 130a of floating gate material 130 in device region 100b may define a floating gate structure. First portion 130a of floating gate material 130 remaining in device region 100b is thicker than compared to conventional floating gate structures. In addition, first portion 130a of floating gate material 130 remaining in device region 100b is thicker than that which remains in device region 100a, which is to be replaced with a gate structure as described elsewhere herein. For example, the width of first portion 130a in device region 110b may be approximately equal to or greater than 10 nm, and the width of first portion 130a in device region 100a may be approximately less than 10 nm. This result may be accomplished by the earlier deposition of dielectric 138 and removing dielectric 138 from device region 100a.

Figure 13:
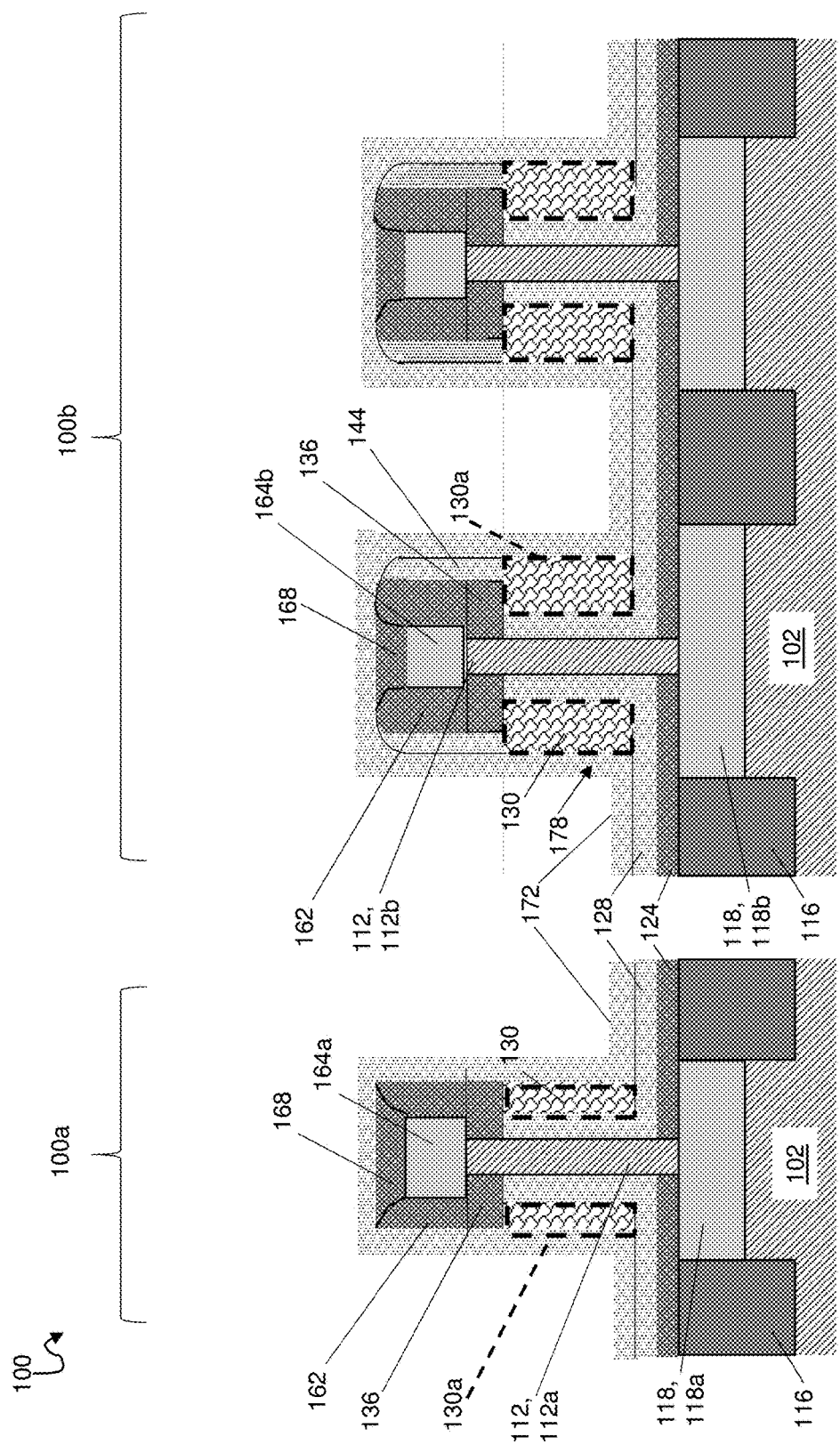
Figure 14:
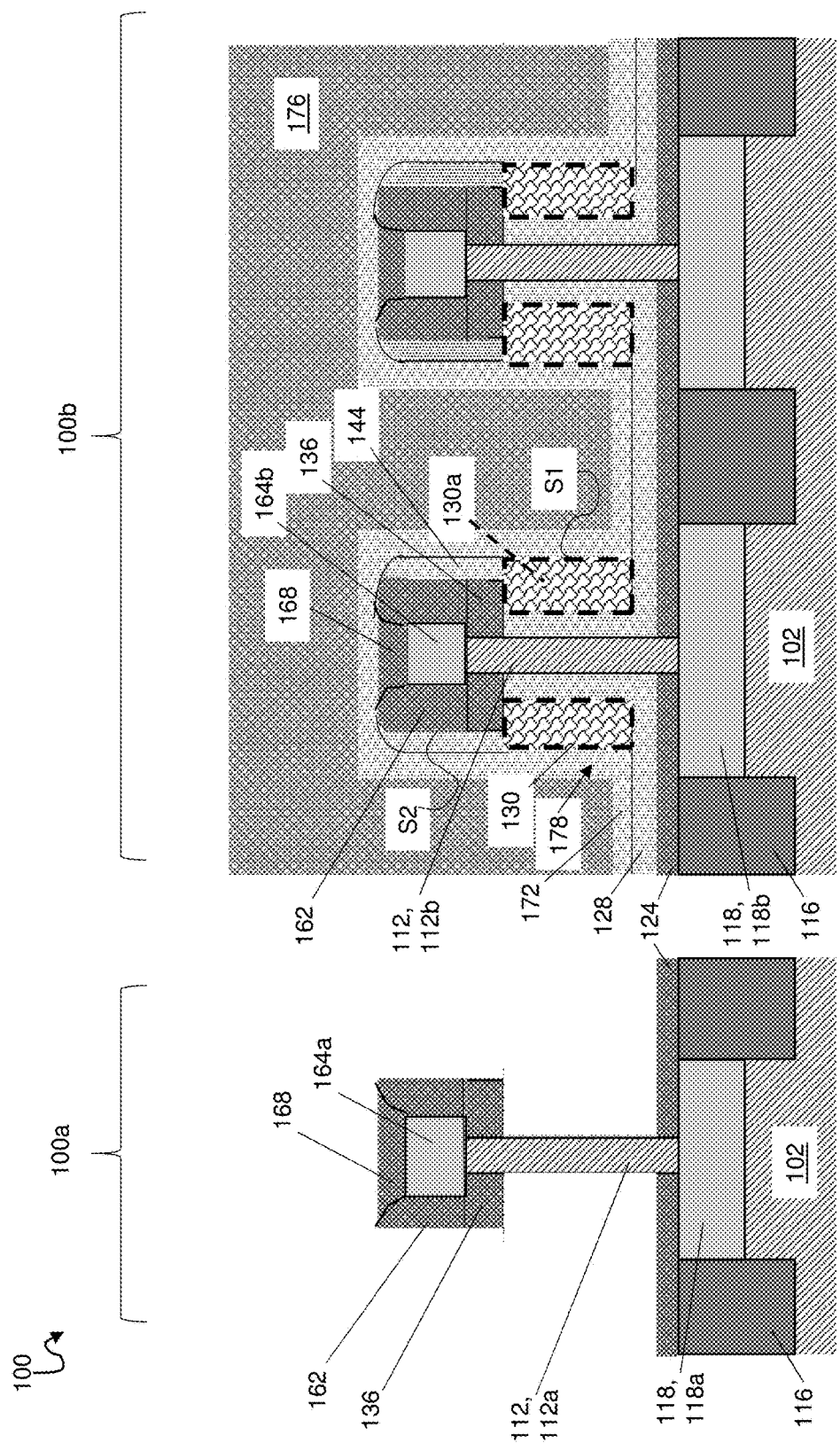

Turning now to FIG. 13, another dielectric 172 may be formed within each device region 100a, 100b such that dielectric 172 is partially disposed laterally adjacent to first portion 130a of floating gate material 130 that remains beneath spacers 136, 162 in each device region 100a, 100b. FIG. 14 shows dielectric 172 being formed relative to the embodiment of FIG. 12. More specifically, dielectric 172 may be conformally deposited within each device region 100a, 100b. As a result, dielectric 172 may be formed over dielectric 128, along sidewalls of first portion 130a of floating gate material 130, over spacers 136, 162, and over cap layer 168 within device region 100a. Additionally, dielectric 172 may be formed over dielectric 128, along sidewalls of first portion 130a of floating gate material 130, over spacers 136, 162, and over cap layer within device region 100b. Dielectric 172 may serve as a top gate dielectric for the resulting memory structure to be formed.

Figure 15:
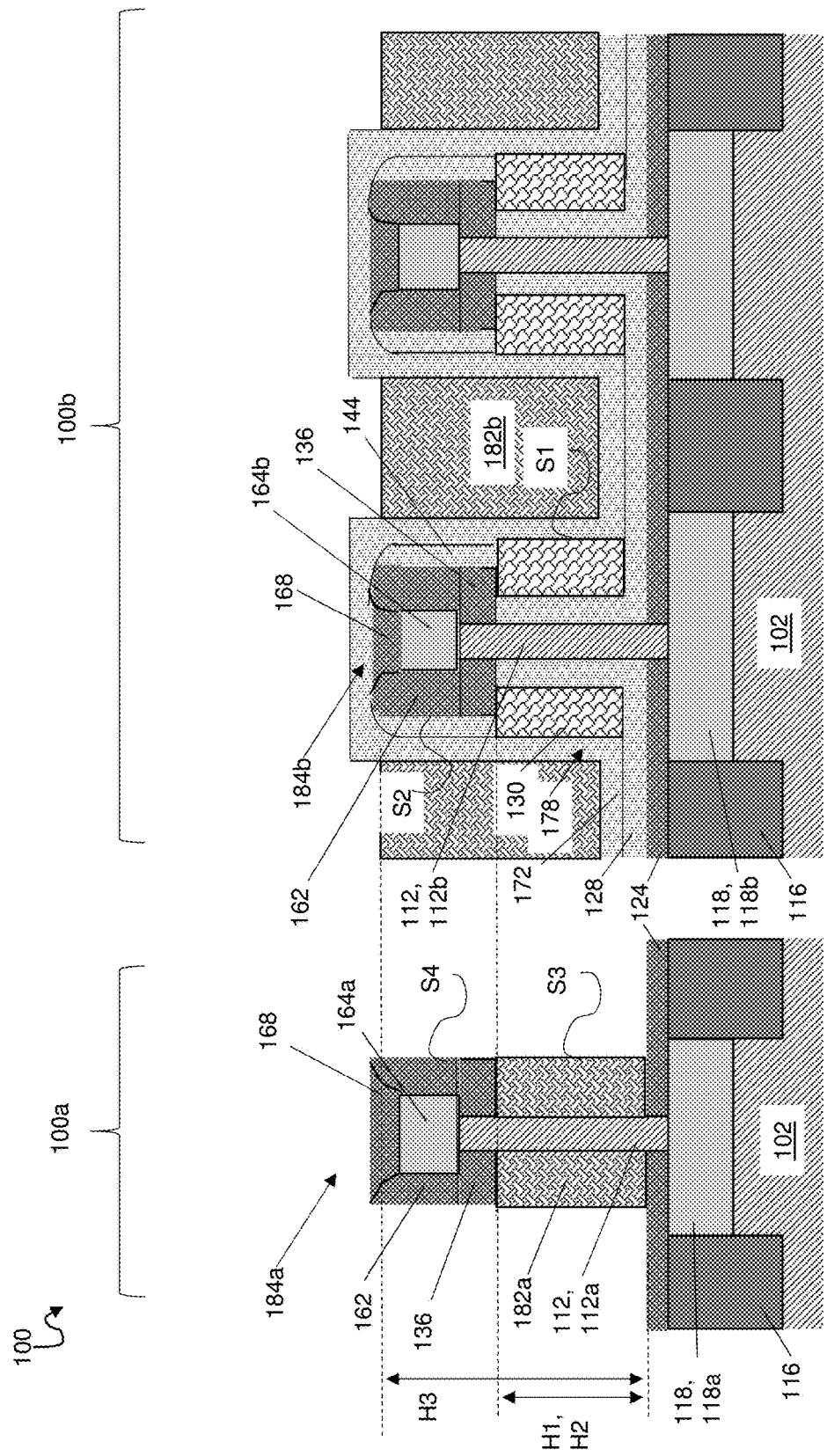

As shown in FIG. 14, another mask 176 may be formed over device region 100b such that device region 100a is exposed. Mask 176 may include any masking materials discussed herein relative to mask 142. Mask 176 may protect device region 100b while device region 100a undergoes additional processing. Specifically, floating gate material 130 and dielectric layers 128, 172 may be removed, e.g., by etching, from device region 100a. As a result, portions of sidewalls of fin 112a within device region 100a may be exposed. After processing of device region 100a, as shown in FIG. 15, mask 176 may be removed. Floating gate material 130 that remains in device region 100b and beneath spacers 136, 144, 162 defines a floating gate or floating gate structure 178 that substantially surrounds fin 112b. A sidewall S1 of first portion 130a of floating gate material 130, i.e., floating gate structure 178 may extend laterally beyond a sidewall S2 of spacer 136, 162 relative to fin 112b.

As shown in FIG. 15, an active or control gate structure may be formed in each device region 100a, 100b. Specifically, a first gate structure 182a may be formed laterally adjacent exposed sidewalls of fin 112a within device region 100a. Additionally, a gate structure 182b may be formed over dielectric 172 within device region 100b such that gate structure 182b is laterally adjacent to first portion 130a of floating gate material 130, i.e., floating gate structure 178. Gate structures 182a, 182b may be formed by deposition of conventional active gate stack materials such as, high-k dielectric followed by work function metal layers, optional barrier layers, and gate conductor layers, denoted together herein as "gate structure" and shown as a single layer in FIG. 15 for brevity. As known in the art, high-k layers may include any dielectric material having a dielectric constant greater than 3.9, examples of which include: metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Work function metal layers may act as a doping source, and a different work function setting metal can then be employed depending on whether an n-type field-effect-transistor (NFET) or a p-type field-effect-transistor (PFET) device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Optional barrier layers may include, for example, titanium nitride, tantalum nitride, hafnium nitride, hafnium silicon nitride, titanium silicon nitride, tantalum silicon nitride, tungsten nitrogen carbide, and hafnium aluminum nitride. Gate conductor layers may include, for example, at least one of: titanium, titanium nitride, tungsten, tungsten nitride, copper, copper nitride, tantalum, or tantalum nitride.

Gate structures 182a, 182b may be formed by deposition of desired gate structure materials. In addition, gate structure 182a within device region 100a may be etched such that gate structure 182a remains beneath spacers 136, 162 adjacent fin 112a, and any gate structure material not protected by spacers 136, 162 may be removed. As a result, gate structure 182a includes a height H1 substantially equal to a height H2 of remaining floating gate material 130 in device region 100b since the space between bottom spacer 124 and spacer 136 in device region 100a that is filled by gate structure 182a is substantially equal to height H2 of floating gate material 130 in device region 100b. Thus, a top surface of gate structure 182a is approximately coplanar with a top surface of floating gate structure 178. In addition, a sidewall S3 of gate structure 182a is laterally aligned with a sidewall S4 of spacers 136, 162 in device region 100a. During the etching, a mask (not shown) may be formed within device region 100b to protect the materials/components within device region 100b from unwanted etching. In addition, gate structure 182b in device region 100b may have a height H3 that is greater than height H1 of gate structure 182a. As a result of gate structure 182a, 182b formation, a vertical field effect transistor (VFET) 184a may be formed in device region 100a. Additionally, a vertical flash memory device 184b may be formed in device region 100b laterally adjacent or proximal to VFET 184a.

Flash memory is an electronic (solid-state) non-volatile computer storage medium that can be electrically erased and reprogrammed. In flash memory, each memory cell resembles a standard metal-oxide-semiconductor field effect transistor (MOSFET), except that the transistor has two gates instead of one. Referring to FIG. 15, gate structure 182b may function as a control gate while floating gate structure 178 functions as a memory storage structure storing a bit in the presence or absence of charge. Floating gate structure 178 may be interposed between gate structure 182b and fin 112b, which acts as a channel. Floating gate structure 178 may be surrounded by an isolation layer, e.g., dielectric 128, 172, and may be considered as being electrically "floating" and isolated from gate structure 182b. Electrons placed on or within floating gate structure 178 are trapped (because floating gate structure 178 is electrically isolated) until they are removed by another application of electric field, e.g. an applied voltage). Altering the charge of floating gate structure 178 results in increasing or decreasing the threshold voltage of the memory cell. Programming or putting electrons into floating gate structure 178 means writing a 0, erasing or removing the charge from floating gate structure 178 means resetting vertical flash memory device 184b contents to 1.

Figure 16:
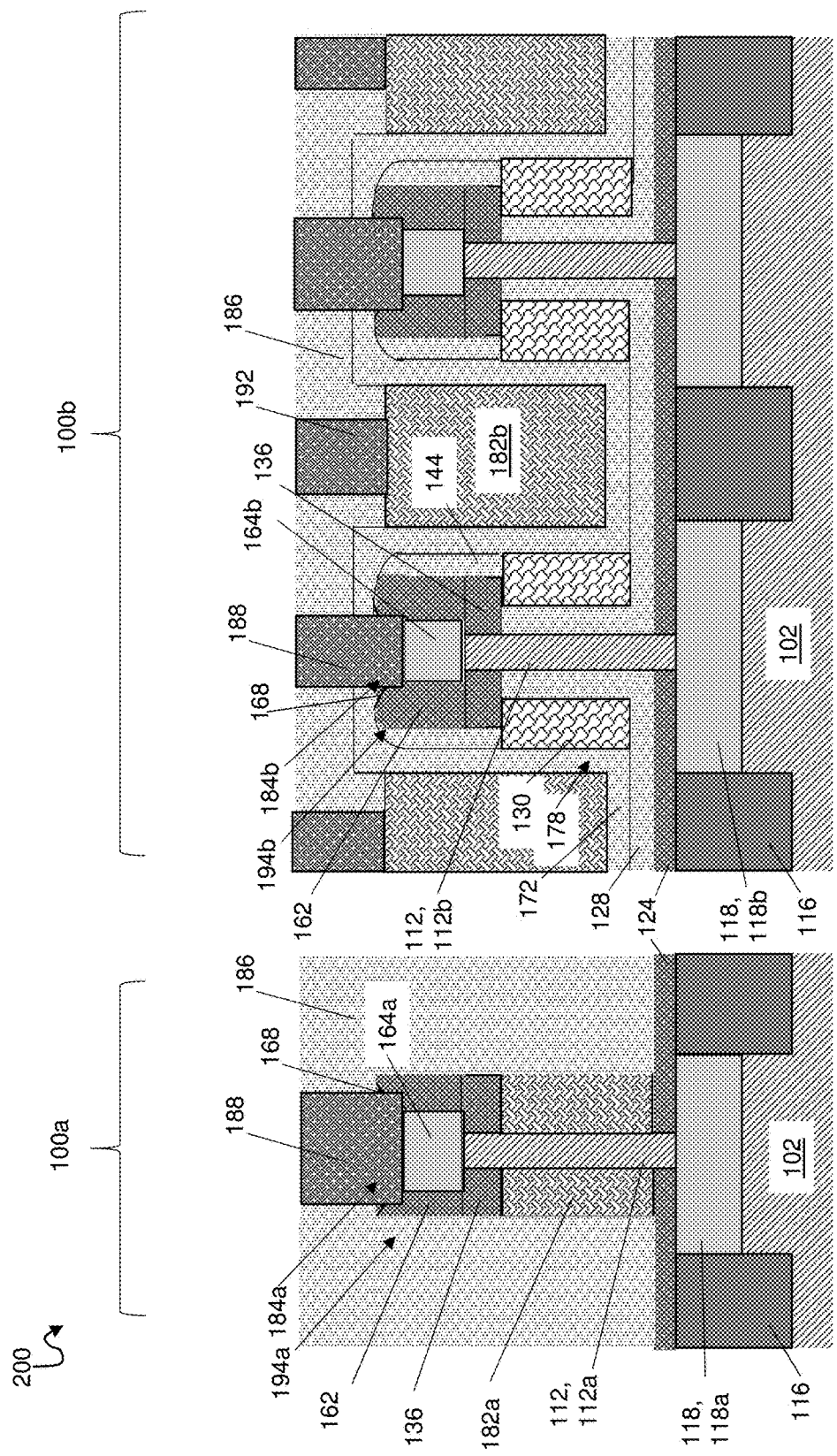

Turning now to FIG. 16, an interlevel dielectric (ILD) 186 may be formed within device regions 100a, 100b. ILD 186 may be formed such that ILD 186 substantially surrounds VFET 184a and vertical flash memory device 184b. ILD 186 may include, for example, at least one of: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. ILD 186 may be formed, e.g., by deposition. In addition, contacts 188 may be formed, e.g., by etching an opening(s) with in ILD 186 to expose components which it is desired to make electrical connections to and depositing contact materials, e.g., liner layers and metals, therein as known in the art. For example, contacts 188 may be formed to top source drain regions 164a, 164b. Additionally, contacts 192 may be formed to gate structures 182a, 182b, and contacts 194 may be formed to bottom source/drain regions 118a, 118b as will be described relative to FIG. 17.

Figure 17:
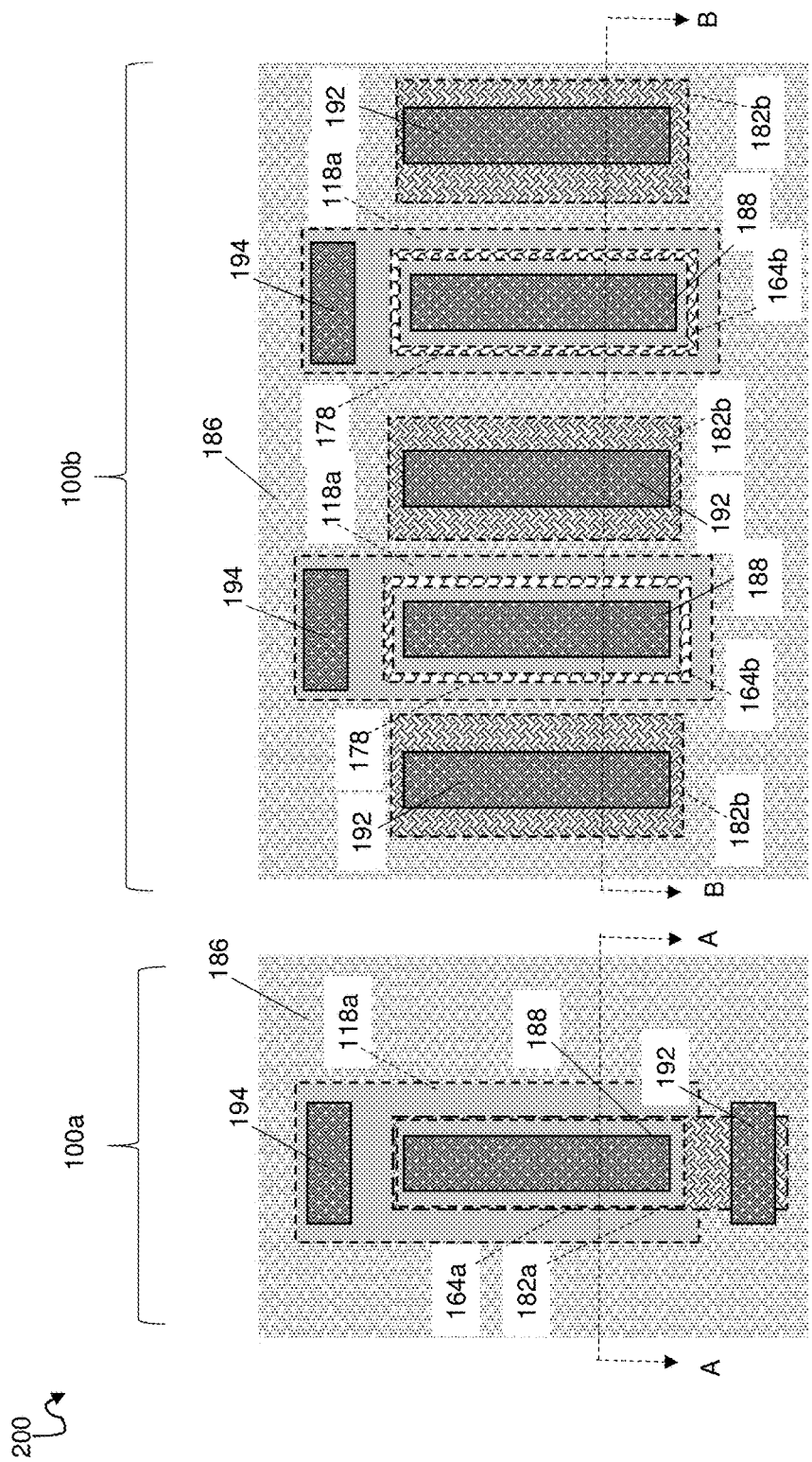
FIG. 17 shows a top-down view of the resulting integrated circuit structure of FIG. 16.

FIG. 17 shows a top-down view of resulting IC structure 200 of FIG. 16 wherein the cross-sectional view of device region 100a in FIG. 16 is taken along line A-A of FIG. 17 and the cross-sectional view of device region 100b in FIG. 16 is taken along line B-B of FIG. 17. In FIG. 17, some features of IC structure 200 are removed in order to highlight certain features in the discussion herein. Additionally, in FIG. 17, some features are shown in phantom because they are actually positioned within ILD 186 beneath contacts 188, 192 and would not ordinarily be seen in this view. For example, top source/drains 164a, 164b are shown in phantom because they are disposed beneath contacts 188 within ILD 186. In addition, gate structure 182a within device region 100a is shown in phantom because gate structure 182 substantially surrounds fin 112a (FIG. 16) and is disposed within ILD 186 beneath contact 188, top source/drain 164a, and spacers 136, 162. However, FIG. 17 shows that gate structure 182a and bottom source/drain 118a may be formed such that each extends laterally beyond regions (up and down relative to the page of FIG. 17) over which top source/drain region 164a is formed such that contacts can be made thereto. That is, since bottom source/drain 118a and gate structure 182a are buried within ILD 186 beneath other structures, contacts 192, 194 to these structures may be formed at end of fins 112 (FIG. 16) as is known in the art by conventional etching and deposition processes. The lateral extensions of bottom source/drain 118a and gate structure 182a may be protected by conventional masking techniques in order to be preserved while IC structure 100 undergoes aspects of the methods described herein. In addition, substrate 102, isolation regions 116, bottom spacer 124, and spacers 136, 162 in device region 100a are not shown in FIG. 17 but are understood to be positioned relative to their positions shown in FIG. 16.

In device region 100b, floating gate structures 178 are shown in phantom because floating gate structures 178 may be formed within ILD 186 beneath top source/drain 164b and contacts 188. As shown, device region 100b may include gate structures 182b laterally adjacent to floating gate structures 178, and thus, contacts 192 may be made directly thereto within ILD 186 by conventional etching and deposition techniques. Further, since bottom source/drains 118b are buried within ILD 186 beneath other structures, contacts 194 to these structures may be formed at end of fins 112b (FIG. 16) as is known in the art by conventional etching and deposition processes. The lateral extensions of bottom source/drains 118b may be protected by conventional masking techniques in order to be preserved while IC structure 100 undergoes aspects of the methods described herein. In addition, substrate 102, isolation regions 116, bottom spacer 124, dielectric 128, 172 and spacers 136, 162 in device region 100b are not shown in FIG. 17 but are understood to be positioned relative to their positions shown in FIG. 16.

FIGS. 16 and 17 show a resulting IC structure 200. IC structure 200 may include device regions 100a and 100b. Device region 100a may include VFET 184a within ILD 186. VFET 184a may include gate structure 182a surrounding a fin 112a that is over substrate 102. A top surface of gate structure 182a may be approximately planar with a top surface of floating gate structure 178 that is disposed in device region 100b. Bottom source/drain 118a may be disposed within substrate 102 and beneath fin 112b and gate structure 182a. Top source/drain 164a may be disposed over fin 112a and gate structure 182a. Spacer 136, 162 may together be considered as a single top spacer 194a. As a result, top spacer 194a may include a bilayer of dielectric material. Top spacer 194a may substantially surround top source/drain 164a and an upper portion of fin 112a that is beneath top source/drain 164a. A sidewall S3 (FIG. 15) of gate structure 182a may be laterally aligned with a sidewall S4 (FIG. 15) of spacers 136, 162. Bottom spacer 124 may be disposed beneath gate structure 182a and above bottom source/drain 182a and substrate 102.

Device region 100b may include vertical flash memory device 184b. Vertical flash memory device 184b may include a floating gate structure 178 substantially surrounding fin 112b that is over substrate 102. Dielectric 128 may be disposed between floating gate structure 178 and fin 112b such that dielectric 128 is laterally adjacent to floating gate structure 178 and fin 112b. Dielectric 128 may also be at least partially laterally disposed between floating gate structure 178 and bottom spacer 124. Bottom source/drain 118b may be disposed within substrate 102 and beneath fin 112a and floating gate structure 178. Top source/drain 164b may be disposed over fin 112b and floating gate structure 178. Spacers 136, 162 may together be considered as a top spacer 194b. Top spacer 194b may be disposed substantially surrounding top source/drain 164b and over the floating gate structure 178. In addition, portions of top spacer 194b may partially surround an upper portion of fin 112b that is disposed beneath top source/drain 164b. A sidewall S1 (FIG. 15) of floating gate structure 178 extends laterally beyond a sidewall S2 (FIG. 15) of spacer 162 relative to fin 112b. Further, gate structure 182b may substantially surround floating gate structure 178 and be disposed over substrate 102. A top surface of gate structure 182b may be approximately planar with a top surface of spacers 144, 162 such that gate structure 182b is free from having spacers 144, 162 thereover. In addition, gate structure 182b may have a height H3 (FIG. 15) greater than a height H1 (FIG. 15) of gate structure 182a. Dielectric 172 may be disposed between floating gate structure 178 and gate structure 182b such that dielectric 172 is partially disposed laterally adjacent to gate structure 182b and floating gate structure 178. Dielectric 172 may also be partially disposed between gate structure 182b and spacers 136, 144, 162. Bottom spacer 124 may be disposed beneath floating gate structure 178, and above bottom source/drain 118b and substrate 102. Additionally, nitride spacer 128 may be disposed beneath floating gate structure 178 and above bottom spacer 124.

Figure 18:
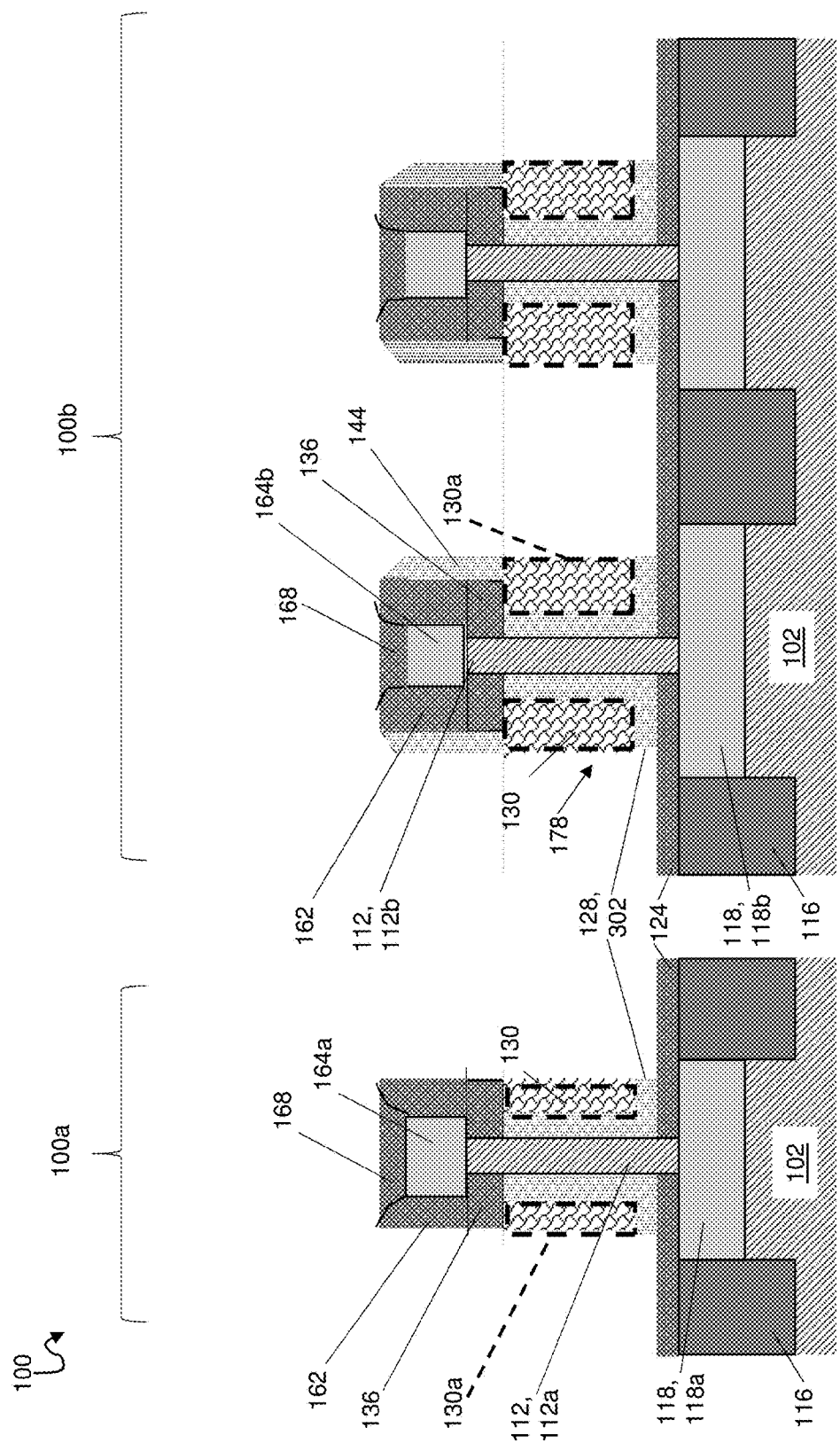
FIG. 18 shows a cross-sectional view of an integrated circuit structure undergoing aspects of a method according to embodiments of the disclosure.
Figure 19:
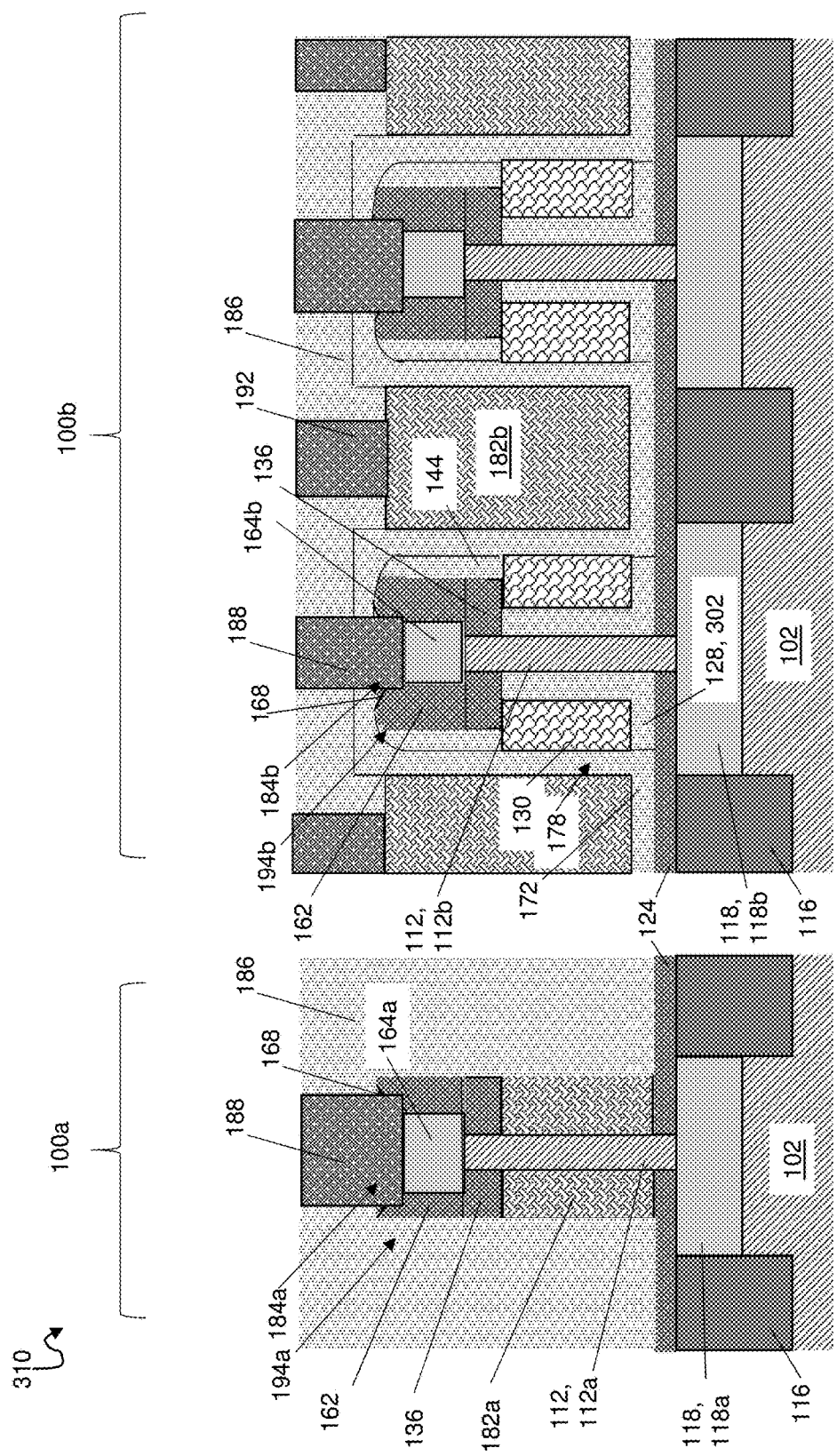
FIG. 19 shows a cross-sectional view of a resulting integrated circuit structure after undergoing aspects of the method according to the embodiment of FIG. 18.

FIGS. 18-19 show an IC structure according to another embodiment of the disclosure. In this embodiment, portions of dielectric 128 may be removed during the etching of floating gate material 130 as was described relative to FIG. 12. That is, dielectric 128 may be etched such that dielectric layer 128 defines substantially L-shaped spacers 302 extending vertically along sidewalls of fins 112a, 112b and horizontally along bottom spacer 124 beneath first portion 130a of floating gate material 130 as shown in FIG. 18. As a result, dielectric 128 may be disposed between first portion 130a of floating gate material 130 and bottom spacer 124, and between first portion 130a of floating gate material 130 and fins 112a, 112b. Additionally, portions of spacers 144 may be partially eroded during this etching of dielectric 128 since they may be of the same material. The method may continue as discussed relative to FIGS. 13-17 with the conformal deposition of dielectric 172 (FIG. 13), the removal of floating gate material 130 and dielectric 128 from device region 100a (FIG. 14), the formation of gate structures 182a, 182b (FIG. 15), and the formation of ILD 186 and contacts 188, 192, 194 (FIGS. 16-17).

FIG. 19 shows a cross-sectional view of a resulting IC structure 310 according to this embodiment after the formation of ILD 186 and contacts 188, 192, 194. In this embodiment, device region 100a is substantially similar to device region 100a of FIG. 16. However, device region 100b of FIG. 19 differs from device region 100b of FIG. 16 in that dielectric 128 forms defines substantially L-shaped spacers 302 and dielectric 172 is conformally formed thereover. That is, dielectric 128 does not extend horizontally along bottom spacer 124 entirely between fins 112b in device region 100b The resulting IC structure of the present disclosure includes both a VFET and an embedded memory device. Methods described herein provide for the fabrication of an embedded memory device laterally adjacent to the VFET within the IC structure. IC structures including embedded memory offer new opportunities for applications like smart car chips, "Internet of Things" (IoT) or systems of interrelated computing devices, smart devices, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit structure comprising:
  a first device region including a vertical flash memory device, the first device region including:
    a floating gate structure substantially surrounding a first fin that is over a substrate;
    a first bottom source/drain within the substrate, and beneath the first fin and the floating gate structure;
    a first top source/drain over the first fin and the floating gate structure;
    a first spacer substantially surrounding the first top source/drain and disposed over the floating gate structure; and
    a gate structure substantially surrounding and insulated from the floating gate structure, the gate structure being disposed over the substrate and having a height greater than a height of the floating gate, the gate structure having a top surface that is approximately planar with a top surface of the first spacer; and
  a second device region including a vertical fin-shaped field effect transistor (VFET), the VFET including:
    a VFET gate structure surrounding a second fin that is over the substrate;
    a second bottom source/drain within the substrate, and beneath the second fin and the second gate structure;
    a second top source/drain over the second fin and the second gate structure; and
    a second spacer substantially surrounding the second top source/drain.

2. The integrated circuit structure of claim 1, wherein the first device region further includes:
  a dielectric disposed between the floating gate structure and the gate structure such that the dielectric is laterally adjacent to the gate structure and the floating gate structure, wherein the dielectric is also disposed between the gate structure and the first spacer.

3. The integrated circuit structure of claim 1, wherein a sidewall of the floating gate structure extends laterally beyond a sidewall of the first spacer relative to the fin.

4. The integrated circuit structure of claim 1, wherein the first spacer partially surrounds an upper portion of the fin that is disposed beneath the first top source/drain.

5. The integrated circuit structure of claim 1, wherein the first device region further includes:
  a dielectric disposed between the floating gate structure and the fin such that the dielectric is laterally adjacent to the floating gate structure and the fin, wherein the dielectric is also disposed between the floating gate structure and a bottom spacer.

6. The integrated circuit structure of claim 1, wherein a sidewall of the VFET gate structure is laterally aligned with a sidewall of the second spacer.

7. The integrated circuit structure of claim 1, wherein a top surface of the VFET gate structure is approximately planar with a top surface of the floating gate structure.

8. The integrated circuit structure of claim 1, wherein the first spacer includes a bilayer of a dielectric material, and wherein the gate structure is free from having the first spacer thereover.

9. The integrated circuit structure of claim 1, wherein the first device region further includes:
  an oxide spacer disposed beneath the floating gate structure, and above the first bottom source/drain and the substrate; and
  a nitride spacer disposed beneath the floating gate structure and above the oxide spacer.

* * * * *